(12) United States Patent
Roh et al.

(10) Patent No.: US 10,485,106 B2
(45) Date of Patent: Nov. 19, 2019

(54) STRUCTURE FOR CONNECTING PRINTED CIRCUIT BOARD AND DISPLAY APPARATUS HAVING THE SAME

(71) Applicant: SAMSUNG ELECTRONICS CO., LTD., Suwon-si (KR)

(72) Inventors: Woo Su Roh, Suwon-si (KR); Sang Won Ha, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/780,967

(22) PCT Filed: Feb. 14, 2017

(86) PCT No.: PCT/KR2017/001587
§ 371 (c)(1),
(2) Date: Jun. 1, 2018

(87) PCT Pub. No.: WO2017/146409
PCT Pub. Date: Aug. 31, 2017

(65) Prior Publication Data
US 2018/0359856 A1 Dec. 13, 2018

(30) Foreign Application Priority Data
Feb. 26, 2016 (KR) ........................ 10-2016-0022973

(51) Int. Cl.
*H05K 1/14* (2006.01)
*G02F 1/1333* (2006.01)
(Continued)

(52) U.S. Cl.
CPC ............. *H05K 1/14* (2013.01); *G02F 1/1333* (2013.01); *H01R 12/79* (2013.01); *H05K 1/182* (2013.01);
(Continued)

(58) Field of Classification Search
CPC .......... H05K 1/14; H05K 1/182; H05K 3/325; H05K 1/147; H05K 2201/09063;
(Continued)

(56) References Cited

U.S. PATENT DOCUMENTS 3,614,714 A * 10/1971 Silverstein ......... H01R 12/7005
439/633
4,416,496 A * 11/1983 Brefka ............... H01R 12/7005
439/362

(Continued)

FOREIGN PATENT DOCUMENTS

| KR | 10-2007-0057302 A | 6/2007 |
| KR | 10-2008-0044046 A | 5/2008 |

(Continued)

OTHER PUBLICATIONS

Written Opinion dated May 22, 2017, issued by the International Searching Authority in counterpart International Patent Application No. PCT/KR2017/001587 (PCT/ISA/237).

(Continued)

*Primary Examiner* — Travis S Chambers
(74) *Attorney, Agent, or Firm* — Sughrue Mion, PLLC (57) ABSTRACT

Disclosed are an improved structure for connecting printed circuit boards and display apparatus having the structure, by which two printed circuit boards are directly connected by a harness without extra parts. A structure for connecting printed circuit boards (PCBs), electrically connecting a first PCB and a second PCB with printed circuits provided thereon, the structure includes fixing holes formed in the first PCB and the second PCB, and a harness fixed to the fixing holes at both ends to electrically connect the first PCB and the second PCB, wherein the harness includes housings arranged in a pair to be fixed to the first PCB and the second PCB and having projections to be inserted and fixed to the fixing holes, contact terminals arranged in the housings to (Continued)

come into contact with the printed circuits, and a cable connected to the contact terminals to electrically connect the pair of housings.

14 Claims, 7 Drawing Sheets

(51) Int. Cl.
*H05K 1/18* (2006.01)
*H01R 12/79* (2011.01)
*H05K 3/32* (2006.01)
*H01R 12/70* (2011.01)
*H01R 12/72* (2011.01)
*H01R 13/64* (2006.01)
*H01R 24/60* (2011.01)

(52) U.S. Cl.
CPC .......... *H05K 3/325* (2013.01); *H01R 12/7023* (2013.01); *H01R 12/721* (2013.01); *H01R 13/64* (2013.01); *H01R 24/60* (2013.01); *H05K 1/147* (2013.01); *H05K 2201/09063* (2013.01); *H05K 2201/10189* (2013.01); *H05K 2201/10757* (2013.01)

(58) Field of Classification Search
CPC .......... H05K 2201/10189; H05K 2201/10757; G02F 1/1333; H01R 12/72–722; H01R 12/7023; H01R 13/64; H01R 24/60
USPC .............. 439/74, 59, 62, 629, 630, 633, 677
See application file for complete search history.

(56) References Cited

U.S. PATENT DOCUMENTS

| | | | | |
|---|---|---|---|---|
| 4,695,112 A | * | 9/1987 | Maston | H01R 12/79 439/328 |
| 5,319,523 A | * | 6/1994 | Ganthier | H05K 1/117 361/753 |
| 2001/0042329 A1 | * | 11/2001 | Murasko | H05B 33/10 40/544 |
| 2002/0028588 A1 | * | 3/2002 | Watanabe | H01R 12/721 439/62 |
| 2008/0079888 A1 | * | 4/2008 | Park | G02F 1/13452 349/149 |
| 2008/0293262 A1 | | 11/2008 | Duesterhoeft et al. | |
| 2009/0004889 A1 | * | 1/2009 | Sakamoto | H01R 13/629 439/59 |
| 2013/0084753 A1 | * | 4/2013 | Huang | H01R 13/648 439/633 |

FOREIGN PATENT DOCUMENTS

| KR | 10-2010-0008574 A | 1/2010 |
|---|---|---|
| KR | 10-1297598 B1 | 8/2013 |

OTHER PUBLICATIONS

Search Report dated May 22, 2017, issued by the International Searching Authority in counterpart International Patent Application No. PCT/KR2017/001587 (PCT/ISA/210).

* cited by examiner

STRUCTURE FOR CONNECTING PRINTED CIRCUIT BOARD AND DISPLAY APPARATUS HAVING THE SAME

TECHNICAL FIELD

The present disclosure relates to a structure for connecting printed circuit boards and display apparatus having the structure.

BACKGROUND ART

In general, an electronic product is equipped with a plurality of printed circuit boards each having a plurality of electronic parts mounted thereon, and the plurality of printed circuit boards are electrically connected.

For example, a display apparatus in which a plurality of printed circuit boards electrically connected are embedded is a kind of output device for converting electrical information to visual information and displaying the visual information to the user, and may include not only the television or the monitor device, but also various portable terminals, for example, a smart phone, a tablet PC, etc.

There exists various kinds of display apparatuses, such as a display apparatus using a Cathode Ray Tube, a display apparatus using Light Emitting Diodes, a display apparatus using Organic Light Emitting Diodes, a display apparatus using Active-Matrix Organic Light Emitting Diodes, a display apparatus using a Liquid Crystal Display, an electronic paper display apparatus, or the like.

In order to electrically connect a printed circuit board to another printed circuit board, a harness to connect a printed circuit board to another printed circuit board via a cable is generally used.

However, since the harness cannot be connected directly to the printed circuit board, a jack is coupled with the printed circuit board for connection of the harness, in which case the harness allows one printed circuit board to be electrically connected to another printed circuit board by connecting the jack coupled with the one printed circuit board to the jack coupled with the other printed circuit board.

Extra parts, jacks are required to use the harness to electrically connect the printed circuit boards, which incurs extra cost problem.

DISCLOSURE

Technical Problem

An aspect of the present disclosure is to provide an improved structure for connecting printed circuit boards and display apparatus having the structure, by which two printed circuit boards may be directly connected by a harness without extra parts, jacks.

Technical Solution

In accordance with one embodiment of the present disclosure, a structure for connecting printed circuit boards (PCBs), electrically connecting a first PCB and a second PCB with printed circuits provided thereon, the structure includes fixing holes formed in the first PCB and the second PCB, and a harness fixed to the fixing holes at both ends to electrically connect the first PCB and the second PCB, wherein the harness includes housings arranged in a pair to be fixed to the first PCB and the second PCB and having projections to be inserted and fixed to the fixing holes, contact terminals arranged in the housings to come into contact with the printed circuits, and a cable connected to the contact terminals to electrically connect the pair of housings.

The first PCB and the second PCB may be configured to be double-sided PCBs and having fixing portions, to which the housings may be fixed, and the fixing holes may be provided in the plural in the fixing portions.

The housing has the form to cover the fixing portion and may be fixed to the fixing portion.

The housing may comprise a top housing corresponding to the top side of the fixing portion, a bottom housing corresponding to the bottom side of the fixing portion, a connecting portion to connect an end of the top housing and an end of the bottom housing, and a containing portion formed by the top housing, the bottom housing, and the connecting portion.

The number of the projections corresponds to the number of the fixing holes, and the projections may comprise an upper projection formed on the bottom side of the top housing to be inserted to an upper portion of the fixing hole and a lower projection formed on the top side of the bottom housing to be inserted to a lower portion of the fixing hole.

The projection may be formed in a rectangular shape or an oval shape, and the fixing hole may be formed to have a shape corresponding to the shape of the projection.

The housing is combined with the fixing portion such that the fixing portion is contained in the containing portion from the perspective of the fixing portion, and if the projection is inserted to the fixing hole, the housing may be fixed to prevent the housing from falling out of the fixing portion.

The fixing portion may have an opening formed to define a combining direction of the housing, and the housing may have a protruding portion formed at a position corresponding to the opening to be received in the opening when the housing is combined with the fixing portion.

The opening may be formed on at least one of the left and right sides of the fixing portion.

The opening may comprise a first opening formed on the left side of the fixing portion and a second opening formed on the right side of the fixing portion, and the first and second openings may be formed to have different length.

The protruding portion may comprise a first protruding portion having a length corresponding to the first opening at a position corresponding to the first opening and a second protruding portion having a length corresponding to the second opening at a position corresponding to the second opening.

The contact terminals may be formed in a pair to correspond to the printed circuits formed on both sides of the first PCB and the second PCB, and may be formed in a linear shape or a curved shape.

The first PCB and the second PCB may be configured to be single-sided PCBs and having fixing portions, to which the housings are fixed, and the fixing holes may be provided in the plural in the fixing portions.

The housing may comprise a top housing corresponding to the top side of the fixing portion, a bottom housing in close contact with the bottom side of the fixing portion, a connecting portion to connect an end of the top housing and an end of the bottom housing, and a containing portion formed by the top housing, the bottom housing, and the connecting portion.

The projection may be formed on the bottom side of the top housing to be inserted to the fixing hole.

Advantageous Effects

According to embodiments of the present disclosure, cost may be saved by omitting extra parts, jacks.

MODES OF THE INVENTION

Embodiments of the present disclosure will now be described in detail with reference to accompanying drawings.

While a flat display apparatus is focused in an embodiment of the present disclosure, the present disclosure may be applied to a curved display apparatus and a bendable or flexible display apparatus adjustable between a curbed state and a flat state.

The present disclosure may be applicable not only to the display apparatus but also to all electronic products with printed circuit boards used therein.

In the following description, the front indicates a side in a forward direction with respect to a display device shown in FIG. 1, the back or behind indicates a side in a backward direction with respect to the display device shown in FIG. 1, the upper portion indicates a portion in an upward direction, and the lower portion indicates a portion in the downward direction.

Figure 1:
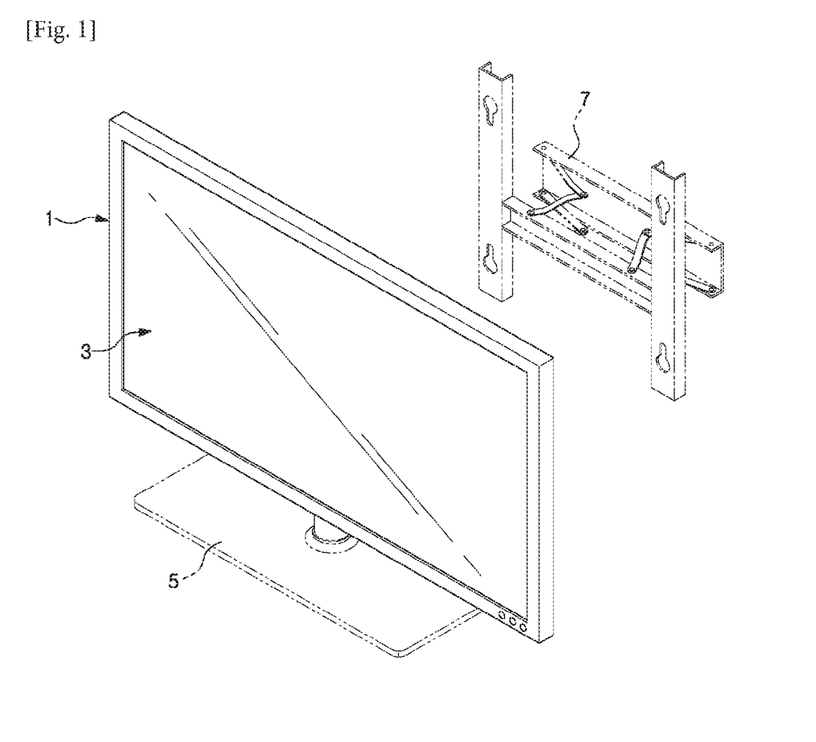
FIG. 1 is a perspective view of a display apparatus, according to an embodiment of the present disclosure.
Figure 2:
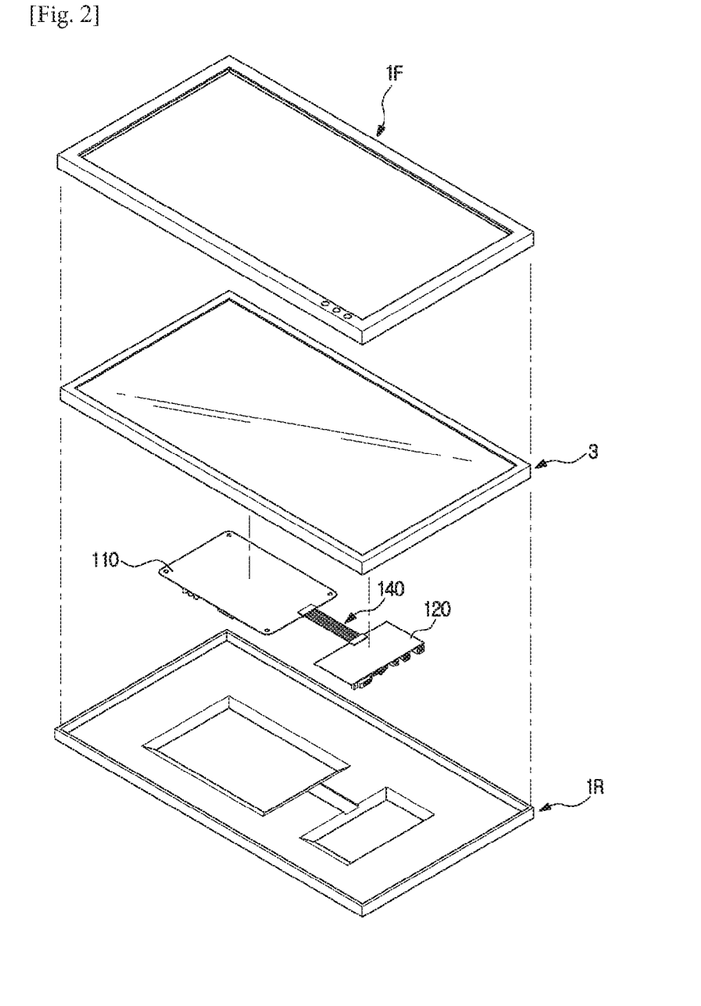
FIG. 2 is an exploded view of a display apparatus, according to an embodiment of the present disclosure.

As shown in FIGS. 1 and 2, the display apparatus includes a case 1 forming the exterior and a display module 3 contained in the case 1 to display an image.

The display apparatus may be used on a stand 5 put on top of e.g., a shelf, or may be used in a wall-mounted type by e.g., a bracket 7 fixed to the wall.

The case 1 includes a front case 1F and a rear case 1R combined together back and forth with the display module 3 installed between them.

Behind the display module 3, a power source substrate 110 for supplying power and a signal processing substrate 120 equipped with various input terminals to process image signals received from outside and send the result to a display panel 10 as will be described later are arranged. The power source substrate 110 and the signal processing substrate 120 are provided as printed circuit boards (PCBs) electrically connected by a harness 140, which will be described below.

Although not shown in the drawings, holes are formed in a bottom chassis 50 for installation of wires to connect the signal processing substrate 120 and the display panel 10, and the power source substrate 110 and the signal processing substrate 120 are covered and hidden by the rear case 1R.

Figure 3:
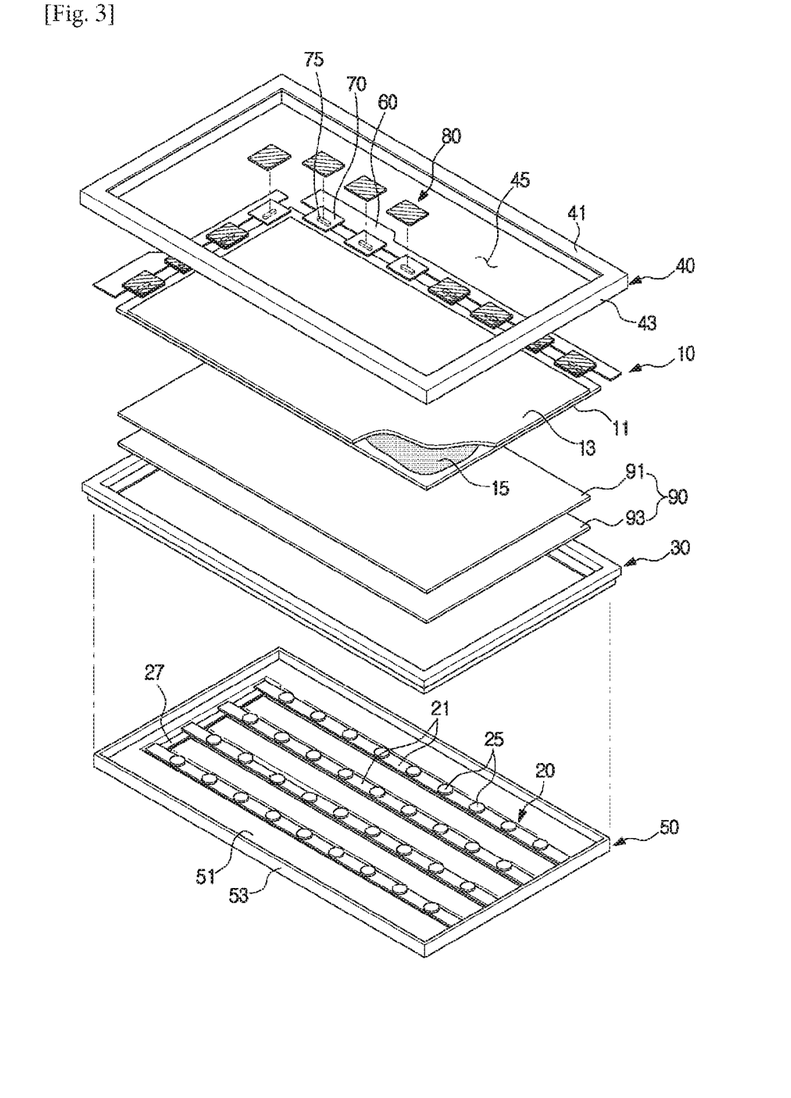
FIG. 3 is an exploded view of a display module applied to a display device, according to an embodiment of the present disclosure.

The display module 3 includes, as shown in FIG. 3, the display panel 10, a backlight unit 20 arranged at a distance under the display panel 10, a middle mold 30 to support the display panel 10 and the backlight unit 20 to be separated from each other, top chassis 40 and bottom chassis 50 arranged on the top of the display panel 10 and the bottom of the backlight unit 20, respectively, a driving PCB 60 for supplying a driving signal to the display panel 10, a plurality of soft circuit films 70 for electrically connecting the display panel 10 and the driving PCB 60 and each having a driving chip 75 mounted on one side, and heat sink units 80 each arranged on the other side of the soft circuit film 70 to radiate heat produced from the driving chip 75.

The display panel 10 is formed with a liquid crystal display panel using liquid crystal, and includes a Thin Film Transistor (TFT) substrate 11 with TFTs formed thereon, a color filter substrate 13 facing the TFT substrate 11, and liquid crystal 15 placed between the TFT substrate 11 and the color filter substrate 13.

The TFT substrate 11 is a transparent glass substrate with TFTs, which are switching devices, formed in a matrix.

The TFTs are connected to data lines at the source terminals, to gate lines at the gate terminals, and to pixel electrodes formed of a transparent conductive material at the drain gates.

The color filter substrate 13 is arranged to face the TFT substrate 11 with a certain gap, and is a substrate with RGB (Red, Green, Blue) pixels, which are color pixels that come in predetermined colors when light passes through them, formed thereon by a thin film process.

On the front side of the color filter substrate 13, a common electrode made of a transparent conductive material is formed.

The display panel 10 with the above configuration produces an electric field between the pixel electrode and the common electrode when power is applied to the gate terminal of the TFT, and undergoes a change in arrangement of liquid crystal interposed between the TFT substrate 11 and the color filter substrate 13 due to the electric field.

The display panel 10 may form an image by controlling arrangement of the liquid crystal 15, but may not emit light by itself. So, the display panel 10 receives light from the backlight unit 20 located in the back side of the display panel 10 to display the image.

The backlight unit 20 includes PCBs 21 having conductive patterns formed thereon and arranged in the back of the display panel 10, LEDs 23 mounted on the front side of the PCB 21 to face the rear side of the display panel 10, and circular lenses 25 installed over the LEDs 23 to spread light emitted from the LEDs 23.

At one ends of the PCBs 21, a connection substrate 27 connecting the one ends of the PCBs 21 is arranged, enabling the PCBs 21 to work together.

The LEDs 23 are provided in the plural and arranged in the longitudinal direction at certain intervals, and the lenses 25 are provided in the plural and respectively installed over the plurality of LEDs 23.

Furthermore, a metal layer (not shown) formed of a metal having superior heat transfer performance, such as copper may be formed for heat radiation on the front side of the PCB 21, on which the LEDs 23 are mounted.

Optical sheets 90 are arranged between the display panel 10 and the backlight unit 20, as shown in FIG. 3, to improve optical properties of light irradiated from the backlight unit 20 to the display panel 10.

The optical sheets 90 include a spread sheet 91 to improve uniformity of brightness by spreading the light irradiated from the back light unit 20 and a light collecting sheet 93 to arrange light direction for the light spread by the spread sheet 91 to be incident on the display panel 10 at the right angle.

A top chassis 40 may be formed of a plastic material and may include a bezel portion 41 wrapping around edges of the display panel 10 and a top flank portion 43 bending from the end of the bezel portion 41. The bezel portion 41 refers to a width from a contour line of the display panel 10 to an active area that actually displays a screen.

An opening 45 is formed in the entire area of the top chassis 40 to expose the active area through the entire area.

A bottom chassis 50 has the form of almost a rectangle, and includes a lower portion 51 in which the backlight unit 20 is settled and a bottom flank portion 53 extending from the edge of the lower portion 51 in the upward direction. The bottom chassis 50 is formed of a heat-conductive metal material to radiate heat delivered from the LED 23.

Next, referring to FIGS. 4 to 13, a structure will be examined in detail, in which the power source substrate 110 and the signal processing substrate 120 are electrically connected by the harness 140.

For convenience of explanation, the power source substrate is referred to as a first PCB 110 and the signal processing substrate is referred to as a second PCB 120.

Figure 4:
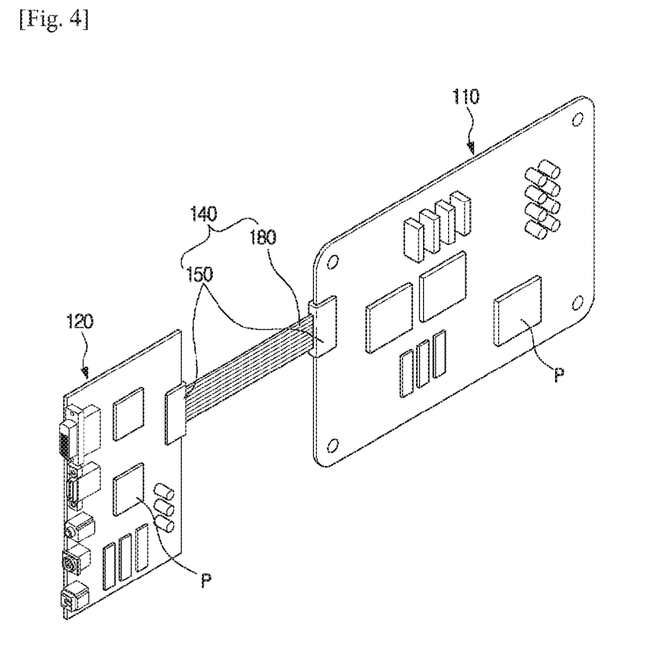
FIG. 4 shows a first printed circuit board and a second printed circuit board connected by a harness, according to an embodiment of the present invention.
Figure 5:
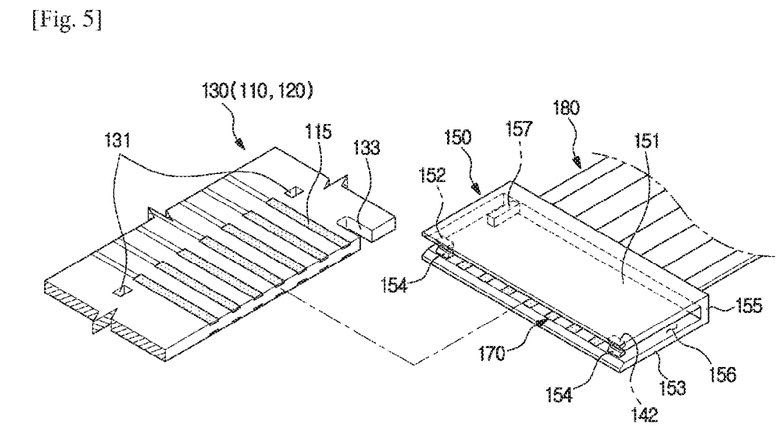
FIG. 5 shows combining of a housing of a harness with a fixing portion of the first and second printed circuit boards, according to an embodiment of the present disclosure.

As shown in FIG. 4, the first PCB and the second PCB with a plurality of electronic parts P mounted thereon are electrically connected by the harness 140.

As shown in FIGS. 5 to 8, the first PCB 110 and the second PCB 120 may each be provided as a double-sided PCB with printed circuits 115 formed on both sides of the PCB. The first PCB 110 and the second PCB 120 have a plurality of fixing portions 130 to which the harness 140 is fixed, and the fixing portions 130 have fixing holes 131 into which the harness 140 is fixed.

The fixing holes 131 are provided in the plural, into which projections 152, 154 formed in a housing 150 of the harness 140, as will be described below, are to be inserted for the housing 150 to be fixed to the fixing portion 130.

The fixing portion 130 has an opening 133 to define a combining direction of the housing 150 to be combined with the fixing portion 130, which will be described below.

The harness 140 for electrically connecting the first PCB 110 and the second PCB 120 may include a pair of housings 150 fixed to the first PCB 110 and the second PCB 120, respectively, contact terminals 170 formed in the housing 150 to contact the printed circuits 115, and a cable 180 to electrically connect the pair of housings 150 by linking the contact terminals 170 formed in the pair of housings 150.

The housing 150 may have the form of 'ㄷ' to be combined with the fixing portion 130 while covering the fixing portion 130 from the flank of the fixing portion 130.

Since the housing 150 is formed in the shape of 'ㄷ' to cover the fixing portion 130, the contact terminals 170 formed in the housing 150 may easily contact the printed circuits 115 of the first PCB 110 and the second PCB 120.

Although the housing 150 is shown to have the form of 'ㄷ' to cover the fixing portion 130 in the drawings, the shape of the housing 150 is not limited thereto but may have other shapes to cover the fixing portion 130.

The housing 150 may include a top housing 151 corresponding to the top side of the fixing portion 130 and a bottom housing 153 corresponding to the bottom side of the fixing portion 130 when the housing 150 is combined with the fixing portion 130, a connecting portion 155 for connecting an end of the top housing 151 and an end of the bottom housing 153, and a containing portion 156, which is a space formed by the top housing, the bottom housing 153, and the connecting portion 155.

The housing 150 is combined with the fixing portion 130 such that the fixing portion 130 is received in the containing portion 156, and when the housing 150 is combined with the fixing portion 130, the projections 152, 154 formed on the housing 150 are inserted to the fixing holes 131, thereby preventing the housing 150 from falling out of the fixing portion 130.

The projections 152, 154 may include an upper projection 152 formed on the bottom of the top housing 151 to be put into the upper portion of the fixing hole 131 and a lower projection 154 formed on the top of the bottom housing 153 to be put into the lower portion of the fixing hole 131.

The upper and lower projections 152 and 154 are formed in corresponding positions to the fixing holes 131 formed on the fixing portion 130 and the number of the upper and lower projections 152 and 154 corresponds to the number of the fixing holes 131.

Figure 6:
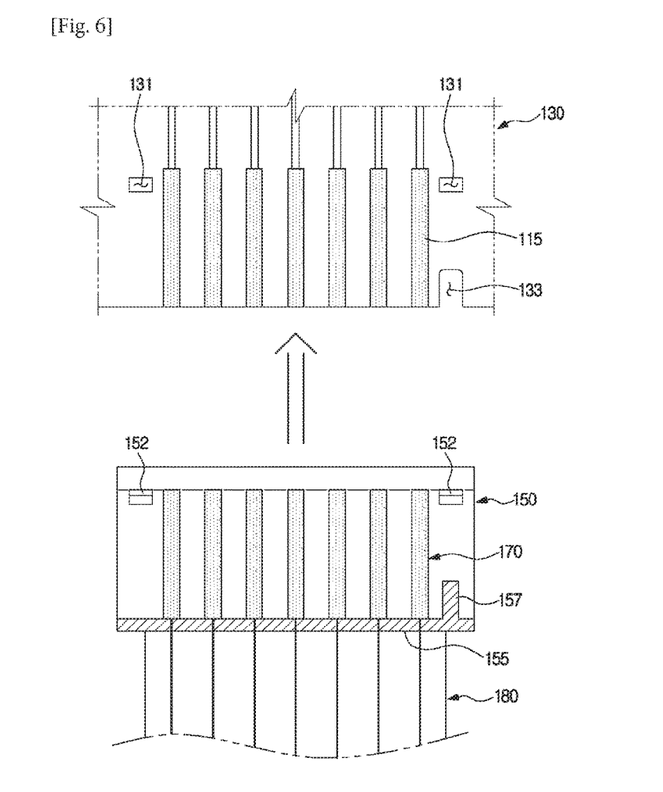
FIG. 6 is a plan view illustrating combining of a housing of a harness with a fixing portion of the first and second printed circuit boards, according to an embodiment of the present disclosure.
Figure 7:
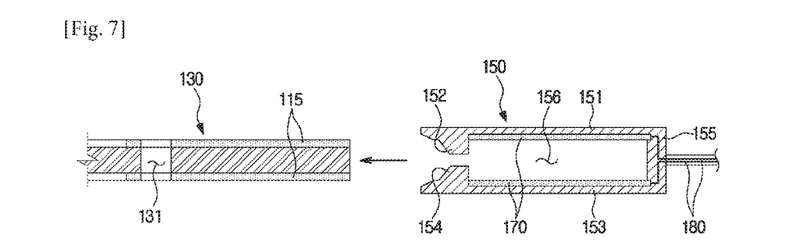
FIG. 7 is a cross-sectional view illustrating combining of a housing of a harness with a fixing portion of the first and second printed circuit boards, according to an embodiment of the present disclosure.
Figure 8:
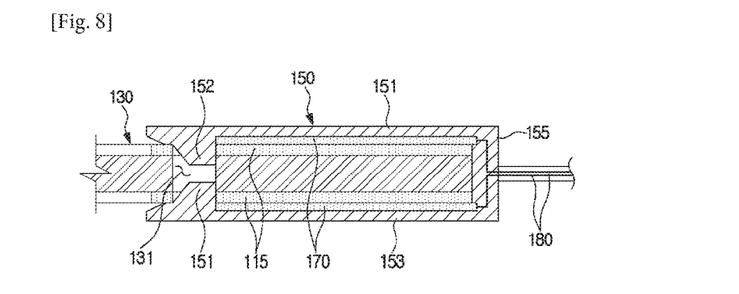
FIG. 8 is a cross-sectional view illustrating a housing of a harness combined with a fixing portion of the first and second printed circuit boards, according to an embodiment of the present disclosure.
Figure 9:
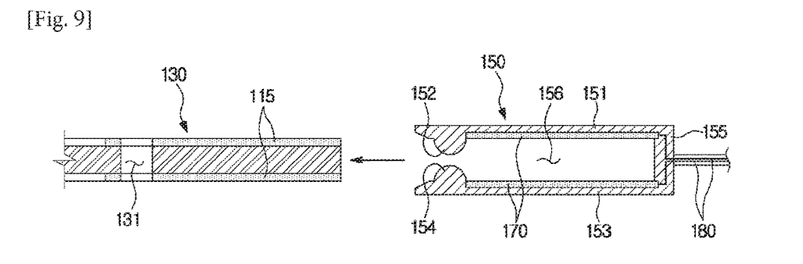
FIG. 9 is a plan view illustrating combining of a housing of a harness with a fixing portion of the first and second printed circuit boards in a case that the fixing portion has a single fixing hole, according to another embodiment of the present disclosure.

As shown in FIG. 6, there may be two of the fixing holes 131 and the corresponding number of the projections 152, 154, and as shown in FIG. 9, there may be one of the fixing hole 131 and the corresponding number of the projections 152, 154.

The projections 152, 154 may have the form of a rectangle, and the fixing holes 131, to which the projections 152, 154 are to be inserted, may have the form that corresponds to the form of the projections 152, 154.

Figure 10:
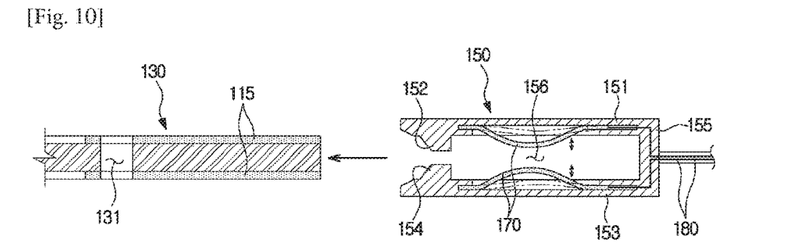
FIG. 10 is a cross-sectional view of a projection, according to another embodiment of the present disclosure.

The form of the projections 152, 154 is not limited to the rectangular shape, but may have an oval shape as shown in FIG. 10.

Although not shown, if the projections 152, 154 have an oval shape, the fixing holes 131 may also have the shape corresponding to the oval-shaped projections 152, 154.

As shown in FIGS. 5 to 8, the housing 150 may have a protruding portion 157 formed at a corresponding position to the opening 133 formed in the fixing portion 130.

The opening 133 formed in the fixing portion 130 and the protruding portion 157 formed in the housing 150 define a combining direction of the housing 150 to be combined with the fixing portion 130, and the opening 133 may be formed on at least one of the left and right of the fixing portion 130.

Since the protruding portion 157 is formed at a corresponding position to the opening 133, if the housing 150 is to be combined with the fixing portion 130 with the top housing 151 located in a lower portion and the bottom housing 153 located in an upper portion, the protruding portion 157 is stuck in the fixing portion 130, hindering the housing 150 from being combined with the fixing portion 130.

Figure 11:
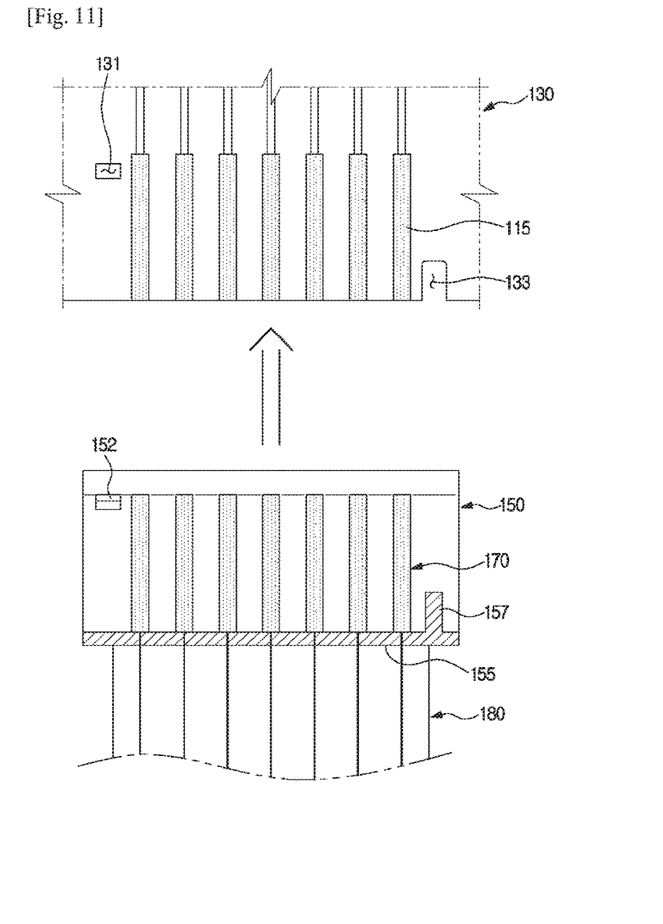
FIG. 11 is a plan view illustrating combining of a housing with a fixing portion in a case that the fixing portion has first and second openings formed therein and the housing has first and second protruding portions formed therein, according to another embodiment of the present disclosure.

As shown in FIG. 11, the opening may be formed on both the left and right sides of the fixing portion 130 to have a first opening 135 on the left of the fixing portion 130 and a second opening 137 on the right of the fixing portion 130.

In the case that the first opening 135 and the second opening 137 are formed on the left and right of the fixing portion 130, respectively, the first opening 135 and the second opening 137 may be formed to have different lengths.

In this case, the protruding portion formed in the housing 150 may include a first protruding portion 158 having corresponding length to the first opening 135 at a position corresponding to the first opening 135, and a second protruding portion 159 having corresponding length to the second opening 137 at a position corresponding to the second opening 137.

Since the first and second openings 135 and 137 formed in the fixing portion 130 have different lengths and the first and second protruding portions 158 and 159 have lengths corresponding to the lengths of the first and second openings 135 and 137, respectively, the housing 150 may not be combined with the fixing portion 130 while the top housing 151 is located in the lower portion and the bottom housing 153 is located in the upper portion.

As shown in FIGS. 5 to 8, the contact terminals 170 are formed in the housing 150, and come into contact with the printed circuits 115 formed on the first and second PCBs 110 and 120 when the housing 150 is fixed to the fixing portion 130.

Since the first and second PCBs 110 and 120 are configured to be double-sided PCBs, the contact terminals 170 may be formed in a pair and may have the form of a straight line.

Figure 12:
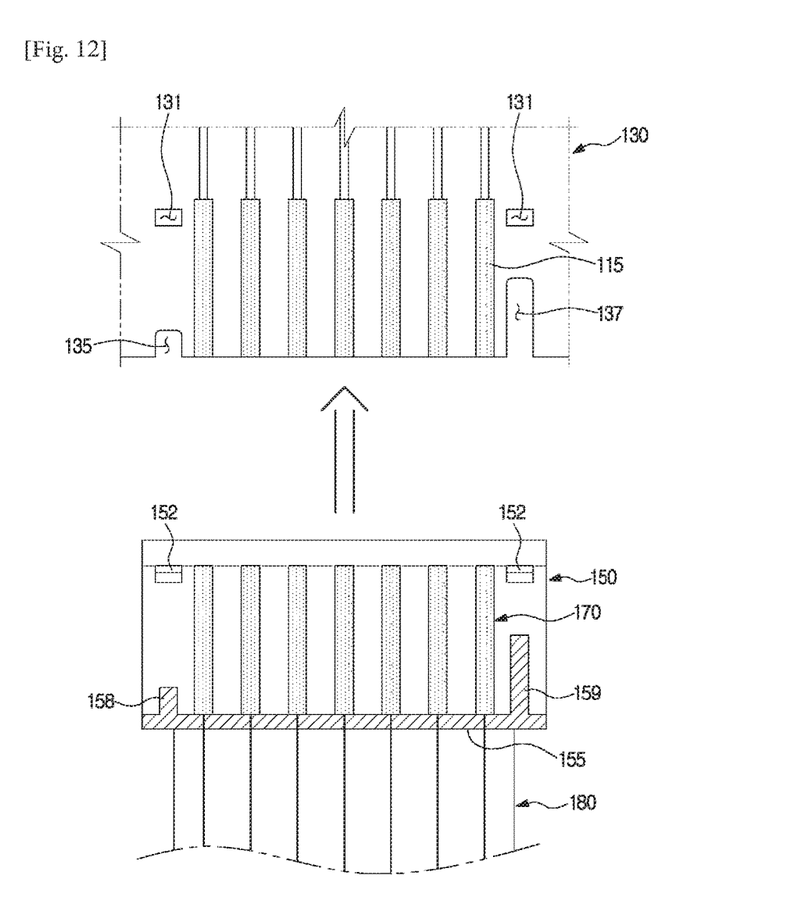
FIG. 12 is a cross-sectional view of a contact terminal, according to another embodiment of the present disclosure.

As shown in FIG. 12, the contact terminals 170 may have a curved form. If contact between the contact terminals 170 in the form of a straight line and the printed circuits 115 does not work well, the contact terminals 170 are configured to have a curved form to facilitate contact between the contact terminals 170 and the printed circuits 115.

Figure 13:
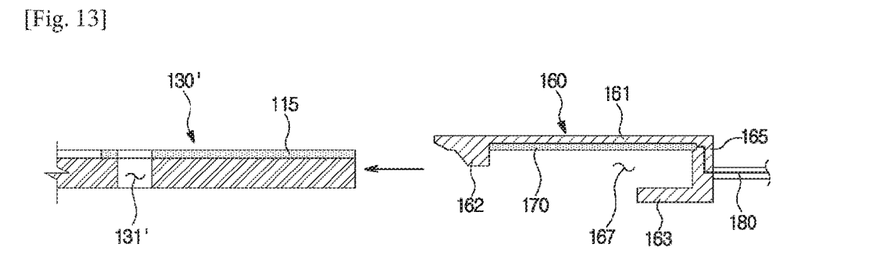
FIG. 13 is a cross-sectional view illustrating combining of a housing of a harness with a fixing portion in a case first and second printed circuit boards are configured to be single-sided printed circuit boards, according to another embodiment of the present disclosure.

As shown in FIG. 13, where the first and second PCBs 110 and 120 are configured to be single-sided PCBs, the printed circuit 115 is arranged only one of the top and bottom sides of a fixing portion 130'.

Even in this case that the first and second PCBs 110 and 120 are configured to be single-sided PCBs, the configuration in which a fixing hole 131' is formed in the fixing portion 130' is the same as an occasion when the first and second PCBs 110 and 120 are configured to be double-sided PCBs.

The shape of the housing 160, however, may be different from the occasion when the first and second PCBs 110 and 120 are configured to be double-sided PCBs.

The housing 160 may include a top housing 161 corresponding to the top side of the fixing portion 130' and a bottom housing 163 in close contact with the bottom side of the fixing portion 130', a connecting portion 165 for connecting an end of the top housing 161 and an end of the bottom housing 163, and a containing portion 167, which is a space formed by the top housing, the bottom housing 163, and the connecting portion 165.

The configuration, in which the bottom housing 163 is in close contact with the bottom side of the fixing portion 130' and has the length shorter than the top housing 161, is different from the configuration of the bottom housing 153 shown in FIGS. 5 to 8.

Furthermore, since the printed circuits 115 are arranged on only one side of the first and second PCBs 110 and 120, a projection 162 is formed on only the bottom side of the top housing 161 and inserted to the fixing hole 131'.

A particular form and orientation is focused in describing a structure for connecting PCBs and display apparatus having the structure with reference to accompanying drawings, but a person of ordinary skill in the art will understand and appreciate that various modifications can be made without departing the scope of the present disclosure. Thus, it will be apparent to those ordinary skilled in the art that the disclosure is not limited to the embodiments described, which have been provided only for illustrative purposes.

The invention claimed is:

1. A structure for connecting printed circuit boards (PCBs), electrically connecting a first PCB and a second PCB with printed circuits provided thereon, the structure comprising:
   fixing portions formed in the first PCB and the second PCB; and
   a harness to electrically connect the first PCB and the second PCB, comprising:
   a pair of housings to be fixed to the fixing portions, each housing including a top housing corresponding to a top side of each of the fixing portion, a bottom housing corresponding to a bottom side of each of the fixing portion and a connecting portion to connect an end of the top housing and an end of the bottom housing;
   contact terminals arranged in the housings to come into contact with the printed circuits; and
   a cable connected to the contact terminals to electrically connect the pair of housings,
   wherein each of the fixing portions has an opening formed to define a combining direction of the housing, and the housing has a protruding portion formed at a position corresponding to the opening to be received in the opening when the housing is combined with the fixing portion, and
   wherein the protruding portion is provided at the connecting portion.

2. The structure for connecting PCBs of claim 1, wherein the structure further comprises fixing holes formed in fixing portions of the first PCB and the second PCB, and
   the pair of housings includes projections to be inserted and fixed to the fixing holes.

3. The structure for connecting PCBs of claim 2, wherein the opening is formed on at least one of the left and right sides of the fixing portion.

4. The structure for connecting PCBs of claim 2, wherein the contact terminals are formed in a pair to correspond to the printed circuits formed on both sides of the first PCB and the second PCB, and are formed in a linear shape or a curved shape.

5. The structure for connecting PCBs of claim 2, wherein the housing has the form to cover the fixing portion and is fixed to the fixing portion.

6. The structure for connecting PCBs of claim 5, wherein the housing further comprises a containing portion formed by the top housing, the bottom housing, and the connecting portion.

7. The structure for connecting PCBs of claim 6, wherein the number of the projections corresponds to the number of the fixing holes, and the projections comprise an upper projection formed on the bottom side of the top housing to be inserted to an upper portion of the fixing hole and a lower projection formed on the top side of the bottom housing to be inserted to a lower portion of the fixing hole.

8. The structure for connecting PCBs of claim 7, wherein the projection is formed in a rectangular shape or an oval shape, and the fixing hole is formed to have a shape corresponding to the shape of the projection.

9. The structure for connecting PCBs of claim 7, wherein the housing is combined with the fixing portion such that the fixing portion is contained in the containing portion from the perspective of the fixing portion, and if the projection is inserted to the fixing hole, the housing is fixed to prevent the housing from falling out of the fixing portion.

10. The structure for connecting PCBs of claim 2, wherein the opening comprises a first opening formed on the left side of the fixing portion and a second opening formed on the right side of the fixing portion, and the first and second openings are formed to have different length.

11. The structure for connecting PCBs of claim 10, wherein the protruding portion comprises a first protruding portion having a length corresponding to the first opening at a position corresponding to the first opening and a second protruding portion having a length corresponding to the second opening at a position corresponding to the second opening.

12. The structure for connecting PCBs of claim 1, wherein the first PCB and the second PCB are configured to be single-sided PCBs and having fixing portions, to which the housings are fixed, and the fixing holes are provided in the plural in the fixing portions.

13. The structure for connecting PCBs of claim 12, wherein the housing comprises a containing portion formed by the top housing, the bottom housing, and the connecting portion.

14. The structure for connecting PCBs of claim 13, wherein a projection is formed on the bottom side of the top housing to be inserted to the fixing hole.

\* \* \* \* \*